United States Patent [19]

Ishikawa

[11] Patent Number: 4,891,577

[45] Date of Patent: Jan. 2, 1990

[54] APPARATUS FOR MEASURING NOISE CHARACTERISTICS

[75] Inventor: Osamu Ishikawa, Kyoto, Japan

[73] Assignee: Matsushita Electric Industrial Co., Ltd., Osaka, Japan

[21] Appl. No.: 113,112

[22] Filed: Oct. 27, 1987

[30] Foreign Application Priority Data

Oct. 31, 1986 [JP] Japan .................................. 61-261244
Nov. 20, 1986 [JP] Japan .................................. 61-277187

[51] Int. Cl.$^4$ ..................... G01R 31/02; G01R 27/00; G01R 1/06
[52] U.S. Cl. ............................... 324/73 R; 324/57 N; 324/57 R; 324/158 P
[58] Field of Search ............... 324/158 F, 158 P, 72.5, 324/73 R, 57 N, 57 R

[56] References Cited

U.S. PATENT DOCUMENTS

| | | | |
|---|---|---|---|
| 4,207,518 | 6/1980 | Hopfer | 324/72.5 |
| 4,419,626 | 12/1983 | Cedrone et al. | 324/72.5 |
| 4,697,143 | 9/1987 | Lockwood et al. | 324/158 F |
| 4,740,746 | 4/1988 | Pollock et al. | 324/158 P |
| 4,764,723 | 8/1988 | Strid | 324/158 F |

OTHER PUBLICATIONS

"tuners—Coaxial: Slide Screw Tuners", Maury Microwave Corporation.
"WPH-300; WPH-305; 40 GHz Wafer Probes", Cascade Microtech.
Technical Data Apr. 1987, Yokogawa Hewlett Packard, Models 8970S/T, 8970B, 8971B, and 346A/B/C; pp. 1-15.
Technical Data Jul. 1987, Yokogawa Hewlett Packard, Model HP8510B; pp. 6-7 and 10-11.

Primary Examiner—Ernest F. Karlsen
Attorney, Agent, or Firm—Wenderoth, Lind & Ponack

[57] ABSTRACT

A device for measuring characteristics of a semiconductor device using a noise measurement system and an impedance measuring system includes an input probe and an output probe for providing connection to the semiconductor device. The device also includes first and second variable impedance devices for respectively varying a source and a load impedance, and respectively connected to the input and output probing devices. First and second switching devices are respectively connected to the first and second variable impedance devices. The switching devices selectively connect the first and second variable impedance devices to the noise measurement system, and selectively connect the first and second variable impedance devices to the impedance measuring system.

9 Claims, 10 Drawing Sheets

APPARATUS FOR MEASURING NOISE CHARACTERISTICS

BACKGROUND OF THE INVENTION

This invention relates to an apparatus for measuring noise characteristics, and more particularly, to an apparatus which is capable of measuring a source impedance (or load impedance) for applying a minimum noise figure in the noise measurement of a transistor.

When measuring noise characteristics of a transistor at high frequency (for example, over 10 GHz), the conventional method was generally to mount a semiconductor chip on a package, and to then make the evaluation in this package state. The important factor in the noise measurement is not only the noise figure, but also the signal source and load impedances that give the minimum noise figure. For the measurement of this minimum noise figure and the source (or load) impedance to give this minimum noise figure, conventionally, it was experimentally adjusted by cutting or connecting the pattern of micro-strip line of the evaluation unit, and the evaluation unit was divided into the input side and output side, and the source and load impedances to give the minimum noise figure were measured. After dividing the evaluation unit, the connector must be connected to the circuit for measurement of impedance, and the source and load impedances varied by this connector, and hence it was impossible to make a measurement accurately. Therefore, the obtained values of source and load impedance to give the minimum noise figure contained significant errors and lacked reliability, and when an impedance conversion circuit was designed by using the obtained impedance values and connected to a transistor, problems e.g., significant noise, occurred.

These values of source and load impedances to give the minimum noise figure obtained in the package state are the values at the end of package, and contain the stray capacitance of the package and induction of the wire, and they are not exactly the impedances connected to the chip of transistor. Particularly, in a compound semiconductor, transistors and micro-strip lines are often formed on a same substrate. In this sense, it is very important to obtain the source (or load) impedance to apply the minimum noise figure as seen from the chip end of the transistor, but it was impossible to measure it in the conventional method. In the conventional method, the evaluation unit of the transistors having input and output circuits must be preliminarily separated into the input side and output side at the transistor part, and it is impossible to measure with an inseparable evaluation unit.

FIGS. 8 A, 8 B are plan and sectional views of a conventional evaluation unit for measuring the minimum noise figure and the signal source (or load) impedance to give this minimum noise figure.

In FIG. 8 A, transistor package 24 is located in the middle of the evaluation unit, and is connected to micro-strip lines 27 of the input side printed circuit board 25 and the output side printed circuit board 26. In this state, input connector 28 and output connector 29 are connected to a noise measuring system, and notch region 30 is provided in micro-strip line 27 so that the noise value may be minimized, and the impedance is adjusted while varying the pattern.

FIG. 8 B shows a sectional view taken along the line A—A' in which, as the support stand is made of copper, aluminum or other material, there are input side block 31 beneath input side printed circuit board 25, output side block 33 beneath output side printed circuit board 26, and transistor block 32 beneath transistor package 24, and they are used as the ground. These three blocks are separable, and they are mutually connected when adjusting micro-strip lines 27 to minimize the noise shown in FIG. 8 A.

FIG. 9 shows the principle of measurement for measuring the source and load impedance as seen from the transistor side after adjusting the micro-strip lines so as to minimize the noise. For the measurement of source impedance $Z_S$ and load impedance $Z_L$, transistor block 32 shown in FIG. 8 B is separated and removed, and the impedances as seen from the transistor side of the input side and output side circuits are measured, and the source and load impedances to give the minimum noise figure are obtained.

FIG. 10 is a sectional view to show the measuring method of the source and load impedances as seen from the transistor side after adjusting the micro-strip lines. After separating and removing transistor block 32 shown in FIG. 8 B, input side block 31 on which input side printed circuit board 25 is mounted is taken out, and transistor side connector 34 is newly connected to the transistor side of input side printed circuit board 25. A 50 Ω load 18 is connected to input connector 28 of the evaluation unit, and already-calibrated measuring connector 35 having a reference plane of impedance measurement 17 is connected to transistor side connector 34, and the source impedance $Z_S$ is measured. The measuring connector 35 is linked to the impedance measuring system through a coaxial cable 8 so that the source impedance $Z_S$ may be measured. When measuring the load impedance, the same procedure as when measuring the source impedance is carried out on the output side printed circuit board 26 and the output side block 33 located beneath it.

In the conventional apparatus for measuring noise characteristics and impedance shown in FIGS. 8, 9, and 10, it is necessary for measuring characteristics to set up the transistor chips in a package and mount on the evaluation unit, and extremely complicated processes are needed, and it takes much time in measurement. Furthermore, if the pattern of the micro-strip lines is adjusted while providing a notch region in the micro-strip lines so that the noise figure may be minimum, the impedance is not varied in a wide range, and the minimum noise figure may not be always accurate. This process also takes much time in adjustment.

Moreover, in the conventional method of measuring the impedance, when measuring the source and load impedances after measuring the noise characteristics while adjusting the pattern of micro-strip lines, it is necessary to measure by cutting off the transistor block located in the middle of the evaluation unit, and it is required to compose the evaluation unit of transistors having input and output circuits so as to be separated into the input side and output side at the transistor part. Therefore, it is impossible to measure the impedance itself with an inseparable evaluation unit, or an evaluation unit to which a connector cannot be newly added. After separating the evaluation unit, if a connector can be newly connected to the input or output side for measurement of impedance, the source and load impedances vary due to the effects of the newly added connector, package leads and others, the errors increase significantly as the frequency becomes higher, thereby making it impossible to measure accurately.

Furthermore, the obtained values of source and load impedances are the values at the end of package, and are not the values at the chip end of transistor. Therefore, when composing by forming transistors and micro-strip lines on a same substrate as in a compound semiconductor device, the results of measurement could not be used, which was an extremely serious problem.

SUMMARY OF THE INVENTION

In the light of the above problems, it is hence a primary object of this invention to present an excellent apparatus for measuring noise characteristics which is capable of measuring the source and load impedance to give the minimum noise figure as the value at the chip end not at the package end, in a short period of time and at high precision.

In order to solve the above problems, a measuring system of this invention comprising a pair of probing circuits for both the input and output each consists of a microwave probe for measuring the transistor characteristics and a variable impedance transformer serially connected thereto through a transmission line by means of connectors provided at the corresponding terminals of the variable impedance transformer and the probe, whereas a coaxial switch is serially connected to the other end of the variable impedance transformer through a transmission line by means of connectors provided at the corresponding terminals of the coaxial switch and the variable impedance transformer, and the microwave probes are switched between a noise measuring system and an impedance measuring system by operating the coaxial switches, so that the noise characteristics of the transistor on the wafer can be measured by adjusting the variable impedance transformer at a condition where the microwave probes and the noise measuring system are contacted, and after that, the signal source (or load) impedance connected to said transistor can be measured without breaking the circuit and the other condition where the microwave probes are contacted on the impedance measuring system by switching the coaxial switches.

In a first measuring method of source and load impedances, the preliminarily calibrated reference plane of the impedance measurement of the impedance measuring system is set at the end of the impedance transformer to which microwave wafer probe is not connected, while a 50 Ω termination, a short circuit termination and an open circuit termination are successively connected to the end of the microwave wafer probe connected to the impedance transformer adjusted in the noise minimum figure, and the impedances as seen from the reference plane of the impedance measurement are measured. Using the three impedance values obtained by sequentially connecting the 50 Ω termination, short circuit termination and open circuit termination to the end of this microwave wafer probe, the impedance of seeing the source or load side from the end of the microwave wafer probe is calculated. In a second method of measurement of the source and load impedances, a first microwave wafer probe having the reference plane of the impedance measurement at the end and a second microwave wafer probe connected to the impedance transformer adjusted in the noise minimum figure are connected with each other by means of a metal pattern, and the impedance of seeing the source or load side from the end of the second microwave wafer probe is measured by using the first microwave wafer probe.

While the novel features of the invention are set forth with particularity in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1:
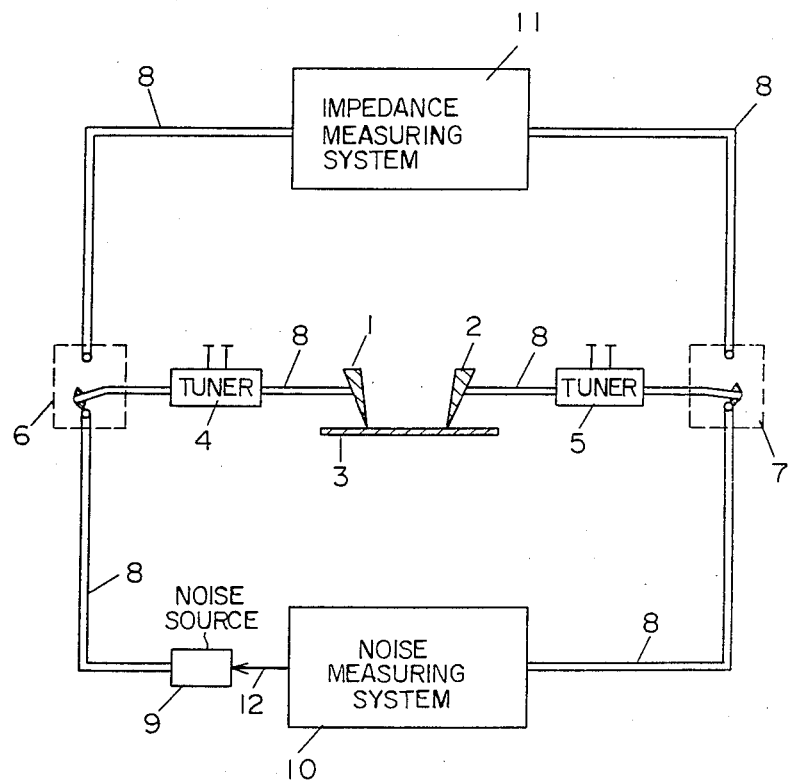
FIG. 1 is a system diagram showing one of the embodiments of the apparatus for measuring noise characteristics of this invention.

FIG. 1 is a system diagram showing an embodiment of the apparatus for measuring noise characteristics in this invention. FIG. 1 is a simplified diagram showing the entire constitution of this invention where all of the ground-side electrodes of all the constituting components (consisting of an input-side microwave probe 1, output-side microwave probe 2, coaxial cable 8, input-side coaxial switch 6, output-side coaxial switch 7, impedance measuring system 11, noise measuring system 10, noise source 9, input-side slide screw tuner 4, and an output-side slide screw tuner 5) are mutually connected, and only the mutual connections of signal lines are shown therein. In FIG. 1, an input side microwave (high frequency) wafer probe 1 and an output side microwave wafer probe 2 are coplanar waveguide type high frequency probes that can be used in a high frequency region of over 10 GHz, and they directly contact the transistor on a wafer 3 to transmit high frequency signals. To the input side and output side microwave wafer probes 1, 2, respectively, an input side slide screw tuner 4 and an output side slide screw tuner 5 are connected. These input side and output side slide screw tuners 4 and 5 are provided to vary the source and load impedances connected to the transistor on the wafer 3, and the impedance can be varied reversibly in a wide range, so that the minimum value of noise may be searched by this adjustment.

One end of input side slide screw tuner 4 and output side slide screw tuner 5 is individually connected to an input side coaxial switch 6 and an output side coaxial switch 7, and by selecting the coaxial switches, either the noise measuring system 10 or the impedance measuring system 11 can be selected through a coaxial cable. Practically, as the noise measuring system 10, a noise figure meter (model 8970A) of Hewlett-Packard of the United States is used, and as the impedance measuring system 11, a network analyzer (model 8510A) of Hewlett-Packard is used. There is a noise source 9 at the noise measuring system 10 side of the input side coaxial switch, and it is supplied with a bias through a direct-current bias line 12 from the noise measuring system 10, and generate a reference value of noise.

Below is described the measuring procedure of source and load impedances for giving the minimum noise figure and for impedance adjustment to obtain the noise minimum figure by using the noise characteristic measuring system of this invention.

(1) The input side microwave wafer probe 1 and output side microwave wafer probe 2 are caused to contact with the transistor on the wafer 3.

(2) The input side coaxial switch 6 and output side coaxial switch 7 are changed over to the noise measuring system 10 side, and the input side slide screw tuner 4 and output side slide screw tuner 5 are adjusted to minimize the noise figure.

(3)- In this case, the input side coaxial switch 6 and output side coaxial switch 7 are changed-over to the impedance measuring system 11 side. (4) The wafer 3 is detached from the input side microwave wafer probe 1 and output side microwave wafer probe 2.

Figure 2:
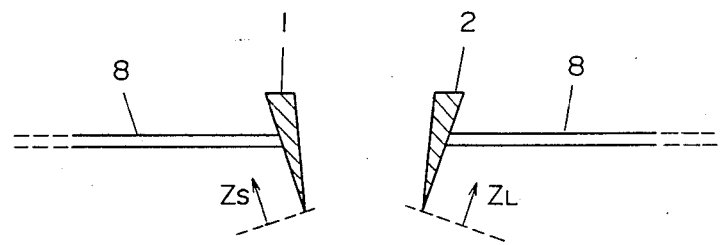
FIG. 2 is an illustration showing the method of measuring the source impedance $Z_s$ or load impedance $Z_L$ by the same apparatus.

(5) As shown in FIG. 2, the source impedance $Z_s$ or load impedance $Z_L$ as seen from the end of input side microwave wafer probe 1 and output side microwave wafer probe 2 is measured. FIG. 2 is also a simplified diagram wherein all of the ground-side electrodes of constituting components (consisting of an input-side microwave probe 1, output-side microwave probe 2, and a coaxial cable 8) are mutually connected, and only the mutual connections of signal lines are shown therein.

Figure 3:
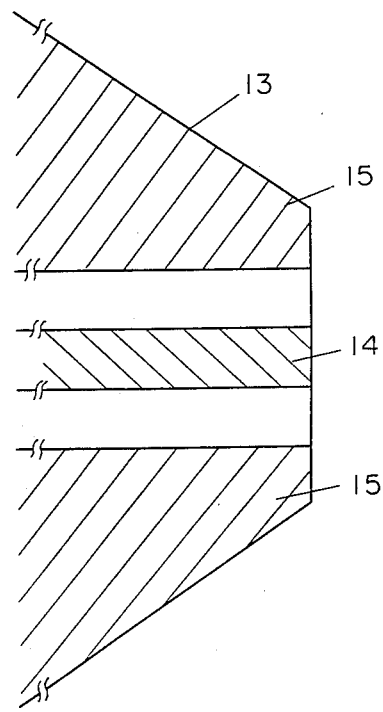
FIG. 3 is an illustration of a microwave wafer probe used in the same apparatus.

In this procedure, the noise and source (or load) impedance can be measure continuously. FIG. 3 shows the rear view of the microwave wafer probe used in this invention, that is, the view from the wafer side. The microwave wafer probe used in this invention is a coplanar waveguide composed of, as shown in FIG. 3, ceramic plate 13, signal line 14, and grounds 15 positioned on both sides, and at its tip it is in contact with the transistor or other device on the wafer to be connected electrically.

Figure 4:
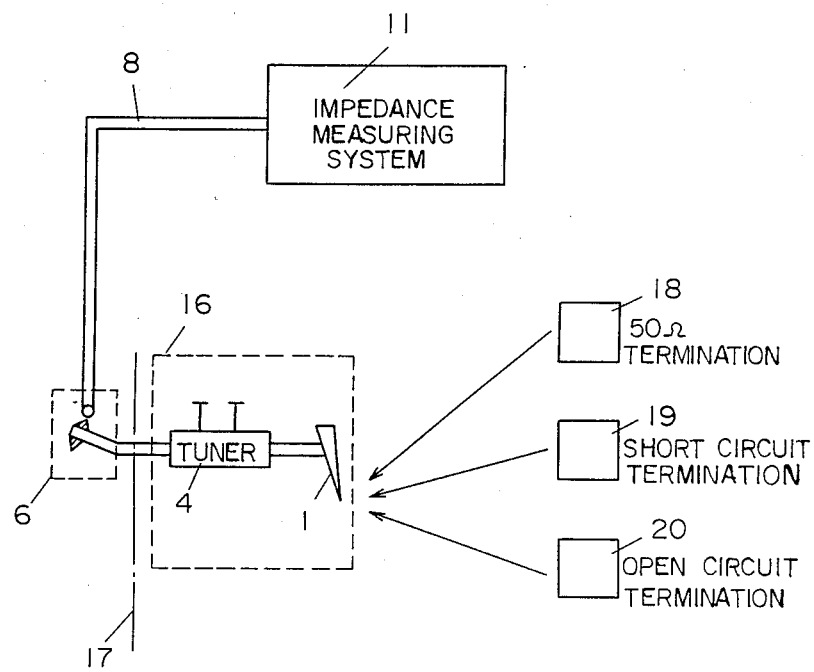
FIG. 4 is a system diagram showing a first method of measuring the impedance of this invention.

The first method of measuring the source and load impedance for giving the minimum noise figure of this invention is explained below. FIG. 4 is a structural drawing to show the first method of measuring the impedance of this invention, in which the input side slide screw tuner 4 adjusted in the minimum noise figure and the unit to be measured 16 containing the input side microwave wafer probe 1 are connected to the impedance measuring system 11 by way of the input side coaxial switch 6. FIG. 4 is also a simplified diagram wherein all of the ground-side electrodes of constituting components (consisting of an input-side microwave probe 1, coaxial cable 8, input-side coaxial switch 6, impedance measuring system 11, and an input-side slide screw tuner 4) are mutually connected, and only the mutual connections of signal lines are shown therein. The reference plane of the impedance measurement 17 is preliminarily calibrated, and is set before the unit to be measured 16, that is, at the impedance measuring system 11 side. In this state, to measure the source impedance as seen from the end of the input side microwave wafer probe 1, the following procedure is taken.

(1) At the end of the input side microwave wafer probe 1, a 50 Ω termination 18 is connected, and the impedance seen from the reference plane of the impedance measurement 17 is measured by the impedance measuring system 11.

(2) The 50 Ω termination 18 is disconnected from the end of the input side microwave wafer probe 1, and a short circuit termination 19 is connected, and the impedance seen from the reference plane of the impedance measurement 17 is measured by the impedance measuring system 11.

(3) The short circuit termination 19 is detached from the end of the input side microwave wafer probe 1, and an open circuit termination 20 is connected, and the impedance seen from the reference plane of the impedance measurement 17 is measured by the impedance measuring system 11.

(4) As a result of the three measurements above, the value of the impedance seeing the signal source from the end of the input microwave wafer probe 1 of the unit to be measured 16 is calculated.

Figure 5:
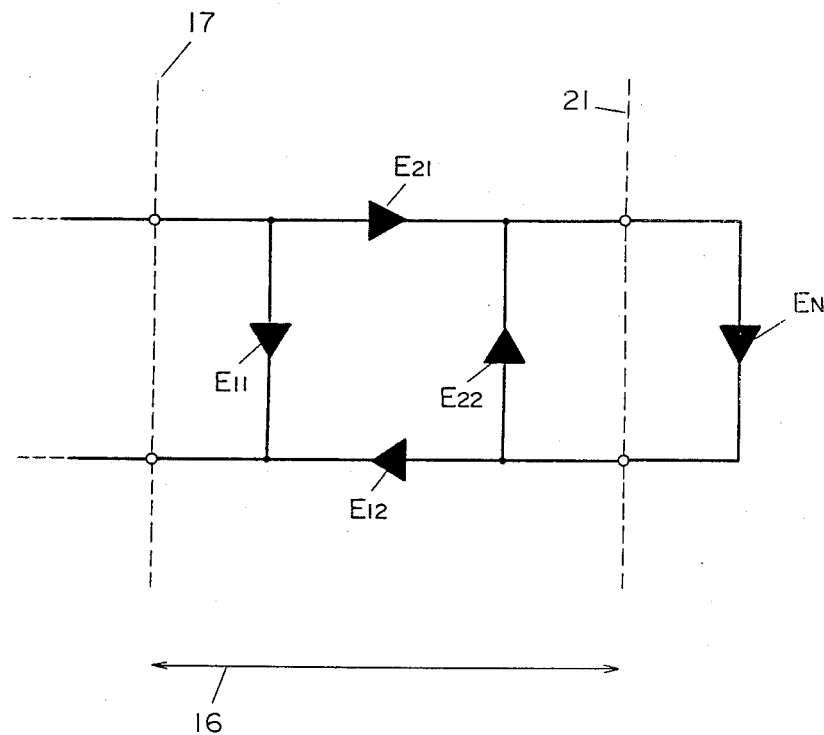
FIG. 5 explains the impedance calculating method of the first method of measuring the impedance of this invention.

FIG. 5 is a signal flowgraph explaining this calculating method. In FIG. 5, the output measurement plane 21 corresponds to the end of the input side microwave wafer probe 1 in FIG. 4. Expressing the unit to be measured 16 in FIG. 4 in [S]parameters, an equivalent circuit may be composed of four parameter (E11, E21, E12, E22) shown in FIG. 5. The source impedance seen from the end of the input side microwave wafer probe 1 of the unit to be measured 16 in FIG. 4 corresponds to E22 in the signal flowgraph in FIG. 5. Therefore, by connecting three known terminals as the reflection coefficient $E_N$ of the load (the reflection coefficient is 0 in 50 Ω termination, −1 in short circuit termination, and +1 in open circuit termination) to the output measurement plane 21, measuring the impedance from the reference plane of the impedance measurement 17, and solving the simultaneous equations by using its results, three coefficients of E22, E11, and E21·E12 can be calculated. That is, the impedance E22 or the source impedance as seen from the end of the input side microwave wafer probe 1 of the unit to be measured 16 can be obtained by calculation.

Figure 6:
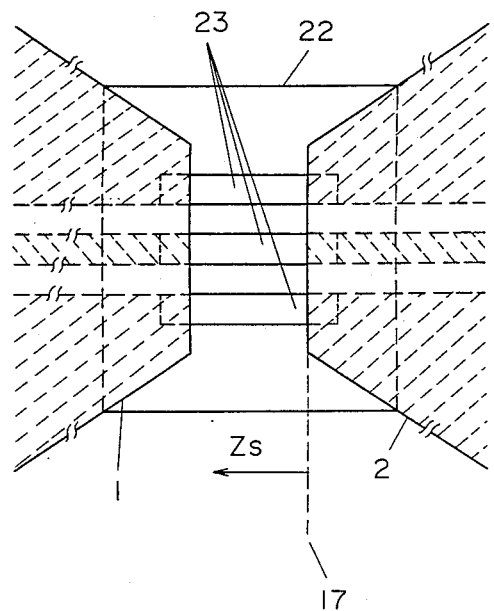
FIG. 6 is an illustration showing a second method of measuring the impedance of this invention.

Referring next to the second method of measuring the source and load impedances to give the minimum noise figure of this invention, FIG. 6 is a structural diagram showing the second method of measuring the impedance of this invention. The second measuring method shown in FIG. 6 is intended to measure the source impedance seeing the source side from the end of the input side microwave wafer probe 1 by using the output side microwave wafer probe 2. By way of a through-pattern 23 formed on a dielectric substrate 22, the corresponding electrode of the input side microwave wafer probe 1 and output side microwave wafer probe 2 are directly connected. Here, when the reference plane of the impedance measurement 17 is set at the end of the output side microwave wafer probe 2, the source impedance $Z_s$ can be measured by using the output side microwave wafer probe 2.

Figure 7:
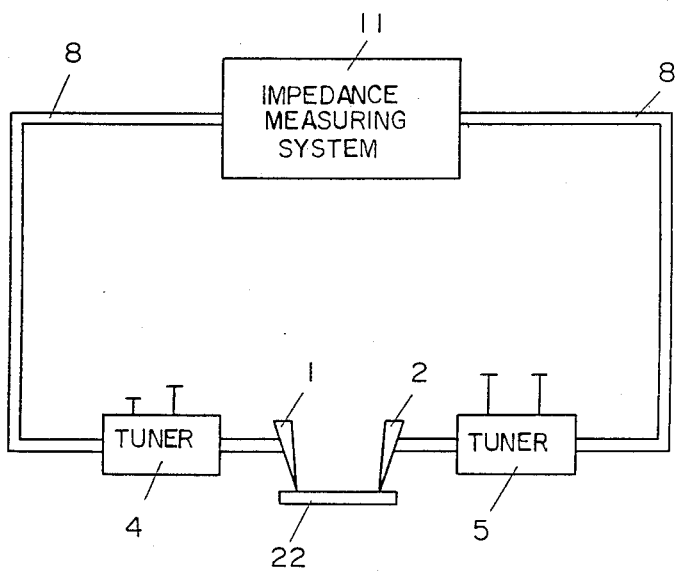
FIG. 7 is a system diagram showing the second method of measuring the impedance of this invention.
Figure 8A:
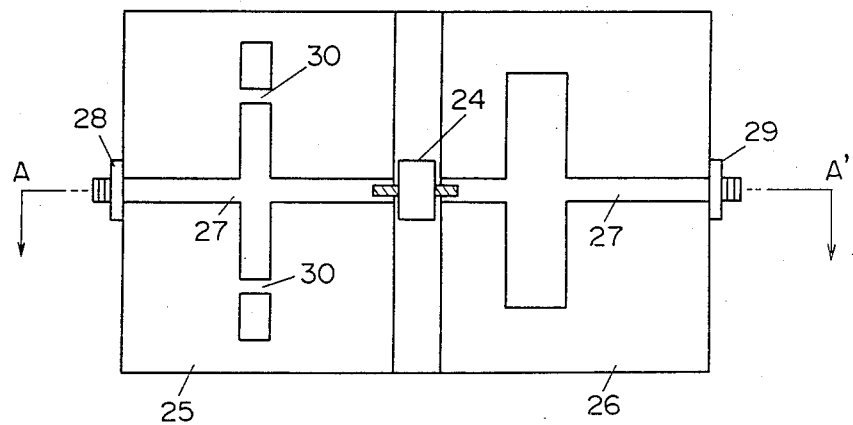
FIG. 8A is a plan view of an evaluation unit to show the conventional method of measuring the minimum noise figure and the source and load impedances for giving the minimum noise value.
Figure 8B:
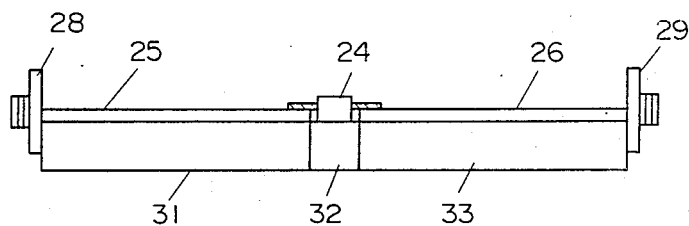
FIG. 8 B is a sectional view taken along the line A-A' in FIG. 8 A.
Figure 9:
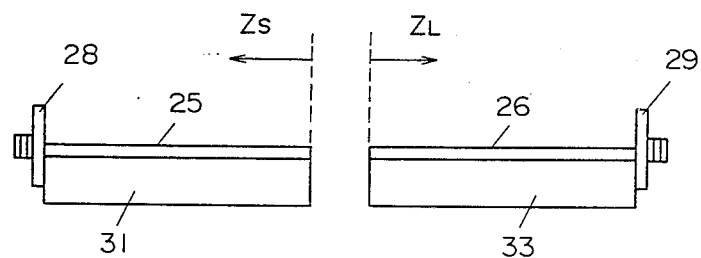
FIG. 9 shows the conventional method of measuring the source and load impedances as seen from the transistor side.
Figure 10:
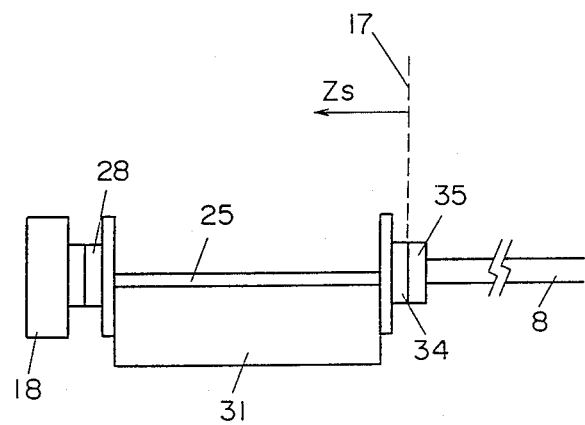
FIG. 10 shows the conventional method of measuring the impedance.

FIG. 7 is a system diagram to show the second method of measuring the impedance of this invention. FIG. 7 is a simplified diagram wherein all of the ground-side electrodes of the constituting components (consisting of an input-side microwave probe 1, output-side microwave probe 2, coaxial cable 8, impedance measuring system 11, noise measuring system 10, input-side slide screw tuner 4, and an output-side slide screw tuner 5) are mutually connected, and only the mutual connections of signal lines are shown therein. As explained in relation to FIG. 6, in the second method of measuring the impedance of this invention, the source impedance seeing the source side from the end of the input side microwave wafer probe 1 is measured by using the output side microwave wafer probe 2, and in this case, the input side slide screw tuner 4 is in the state of adjusting the impedance to the minimum noise figure, while the output side slide screw tuner is in through state, that is, 50 Ω transmission state, and the measurement is taken in this state. On the dielectric substrate 22, there is a through-pattern 23 as shown in FIG. 6, and the corresponding electrodes of the input side microwave wafer probe 1 and output side microwave wafer probe 2 are directly connected, so that the source impedance can be measured by setting the reference plane of the impedance measurement at the end of the output side microwave wafer probe 2. In FIG. 7, the noise measuring system is omitted because it is identical with the one shown in FIG. 1.

The following benefits, among others, are obtained by employing the noise characteristic measuring system and impedance measuring method of this invention.

(1) It is not necessary to set up transistor chips in a package, and it is possible to measure, in the wafer state, the noise of transistor and the source (or load) impedance to give the minimum noise figure.

(2) By using a variable impedance transformer, the impedance can be reversibly adjusted in a wide range, and the adjustment for minimizing the noise figure is simple and accurate.

(3) Impedance measurement for obtaining the minimum noise figure and the source and load impedance for giving the minimum noise figure can be done continuously only by changing over the coaxial switch.

(4) Since the impedance measuring method does not require connection of a new connector for measurement of the source (or load) impedance, it is possible to measure precisely even in high frequency region.

(5) The measured values of source and load impedances are the values of source and load impedance for giving the minimum noise figure at the chip end of the transistor, which may be very useful for the designing of one-body type microwave monolithic integrated circuit having transistor and micro-strip lines formed on a same substrate, such as a compound semiconductor device.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

We claim:

1. A system for measuring characteristics of a semiconductor device using a noise measuring system and an impedance measuring system, said system comprising:
    an input probing means and an output probing means for providing connection to the semiconductor device;
    first and second variable impedance means for respectively varying a source and a load impedance, and respectively connected to said input probing means and said output probing means;
    first and second switching means respectively connected to said first and second variable impedance means and each having means for connection to the noise measuring system and the impedance measuring system, said first and second switching means for selectively connecting said first and second variable impedance means to one of the noise measuring system and the impedance measuring system.

2. The system according to claim 1, wherein said first and second switching means each includes a coaxial switch.

3. The system according to claim 1, wherein said first and second variable impedance means each includes a slide screw tuner.

4. The system according to claim 2, wherein said first and second variable impedance means each includes a slide screw tuner.

5. The system according to claim 1, wherein said input probing means and said output probing means each includes a microwave frequency wafer probe.

6. The system according to claim 2, wherein said input probing means and said output probing means each includes a microwave frequency wafer probe.

7. The system according to claim 3, wherein said input probing means and said output probing means each includes a microwave frequency wafer probe.

8. The system according to claim 4, wherein said input probing means and said output probing means each includes a microwave frequency wafer probe.

9. The system according to claim 1, wherein said semiconductor device is a transistor.

* * * * *